United States Patent
Murakami

(10) Patent No.: US 9,899,591 B2
(45) Date of Patent: Feb. 20, 2018

(54) PIEZOELECTRIC ACTUATOR, PIEZOELECTRIC VIBRATION APPARATUS, AND PORTABLE TERMINAL

(71) Applicant: KYOCERA Corporation, Kyoto-shi, Kyoto (JP)

(72) Inventor: Michiya Murakami, Kirishima (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 356 days.

(21) Appl. No.: 14/439,111

(22) PCT Filed: Dec. 17, 2013

(86) PCT No.: PCT/JP2013/083744
§ 371 (c)(1),
(2) Date: Apr. 28, 2015

(87) PCT Pub. No.: WO2014/098077
PCT Pub. Date: Jun. 26, 2014

(65) Prior Publication Data
US 2015/0311423 A1    Oct. 29, 2015

(30) Foreign Application Priority Data
Dec. 17, 2012 (JP) .................... 2012-274741

(51) Int. Cl.
*H01L 41/083* (2006.01)
*H01L 41/047* (2006.01)
(Continued)

(52) U.S. Cl.
CPC ........ *H01L 41/0475* (2013.01); *H01L 41/083* (2013.01); *H04R 17/00* (2013.01);
(Continued)

(58) Field of Classification Search
CPC ..................... H01L 41/0475; H01L 41/0533
(Continued)

(56) References Cited

U.S. PATENT DOCUMENTS

| 8,521,239 B2 * | 8/2013 | Hosoi | G02C 11/06 |
| | | | 455/575.1 |
| 2012/0000554 A1 * | 1/2012 | McIntyre | F16K 31/0696 |
| | | | 137/561 R |
| 2012/0289162 A1 * | 11/2012 | Hosoi | H04R 25/606 |
| | | | 455/41.3 |

FOREIGN PATENT DOCUMENTS

| JP | 06-014396 A | 1/1994 |
| JP | 2002-010393 A | 1/2002 |

(Continued)

OTHER PUBLICATIONS

International Search Report, PCT/JP2013/083744, dated Mar. 11, 2014, 2 pgs.

*Primary Examiner* — Thomas Dougherty
*Assistant Examiner* — Karen B Addison
(74) *Attorney, Agent, or Firm* — Volpe and Koenig, P.C.

(57) ABSTRACT

There are provided a piezoelectric actuator having reduced noise caused by the vibration of a piezoelectric element is reduced, a piezoelectric vibration apparatus and a portable terminal. A piezoelectric actuator includes a piezoelectric element which includes a stacked body in which internal electrodes and piezoelectric layers are laminated, and a surface electrode disposed on one main surface of the stacked body so as to be electrically connected to the internal electrodes; and a flexible substrate electrically joined to the surface electrode; and a reinforcing plate fixedly attached to a region of the flexible substrate where the flexible substrate overlaps with the piezoelectric element, the reinforcing plate being provided with a bend portion.

10 Claims, 5 Drawing Sheets

(51) Int. Cl.
*H04R 17/00* (2006.01)
*H05K 1/18* (2006.01)
*H05K 3/32* (2006.01)

(52) U.S. Cl.
CPC .......... *H05K 1/189* (2013.01); *H04R 2499/11* (2013.01); *H05K 3/323* (2013.01); *H05K 2201/10083* (2013.01); *H05K 2201/2009* (2013.01)

(58) Field of Classification Search
USPC .................. 310/366–365, 328, 365–367
See application file for complete search history.

(56) References Cited

FOREIGN PATENT DOCUMENTS

| | | | | |
|---|---|---|---|---|
| JP | 2003-023186 A | 1/2003 | | |
| JP | 2004-276487 A | 10/2004 | | |
| JP | 2011-199206 A | 10/2011 | | |
| JP | 2004-276487 | * 7/2014 | .......... | H01L 41/047 |
| WO | 2012/117738 A1 | 9/2012 | | |

* cited by examiner

PIEZOELECTRIC ACTUATOR, PIEZOELECTRIC VIBRATION APPARATUS, AND PORTABLE TERMINAL

TECHNICAL FIELD

The present invention relates to a piezoelectric actuator which is suitable for use in a piezoelectric vibration apparatus and a portable terminal, a piezoelectric vibration apparatus, and a portable terminal.

BACKGROUND ART

As piezoelectric actuators, there are known a device which employs a bimorph-type piezoelectric element constructed by forming a surface electrode on a surface of a staked body in which a plurality of internal electrodes and piezoelectric layers are laminated (refer to Patent Literature 1) and a device constructed by joining a piezoelectric element and a flexible substrate together in a manner such that a surface electrode of the piezoelectric element and a wiring conductor of the flexible substrate are electrically connected to each other (refer to Patent Literature 2).

CITATION LIST

Patent Literature

Patent Literature 1: Japanese Unexamined Patent Publication JF-A 2002-10393
Patent Literature 2: Japanese Unexamined Patent Publication JP-A 6-14396 (1994)

SUMMARY OF INVENTION

Technical Problem

Herein, vibration of the piezoelectric element is transmitted to the flexible substrate, and, the flexible substrate vibrates in response to the vibration of the piezoelectric element. As a consequent problem, long-terra driving operation results in the possibility of separation of the flexible substrate from the piezoelectric element under the influence of the vibration.

The invention has been devised in view of the circumstances as mentioned supra, and accordingly an object of the invention is to provide a piezoelectric actuator in which separation of a flexible substrate is suppressed under the influence of vibration of a piezoelectric element, a piezoelectric vibration apparatus, and a portable terminal.

Solution to Problem

The invention provides a piezoelectric actuator comprising: a piezoelectric element which comprises a stacked body in which internal electrodes and piezoelectric layers are laminated, and a surface electrode disposed on one main surface of the stacked body so as to be electrically connected to the internal electrodes; a flexible substrate electrically joined to the surface electrode; and a reinforcing plate fixedly attached to a region of the flexible substrate where the flexible substrate overlaps with the piezoelectric element, the reinforcing plate being provided with a bend portion.

Moreover, the invention provides a piezoelectric vibration apparatus comprising: the above-described piezoelectric actuator; and a vibration plate joined to the other main surface of the stacked body constituting the piezoelectric actuator.

Furthermore, the invention provides a portable terminal comprising: the above-described piezoelectric actuator; an electronic circuit; a display; and a casing, the other main surface of the stacked body constituting the piezoelectric actuator being joined to the display or the casing.

Advantageous Effects of Invention

According to the invention, by virtue of the provision of the reinforcing plate having the bend portion, it is possible to obtain the piezoelectric actuator capable of suppressing separation of the flexible substrate under the influence of vibration of the piezoelectric element even after long-term driving operation.

DESCRIPTION OF EMBODIMENTS

One embodiment of a piezoelectric actuator pursuant to the invention will be described in detail with reference to drawings.

FIG. 1(a) is a schematic perspective view showing one embodiment of a piezoelectric actuator pursuant to the invention, and FIG. 1(b) is a schematic sectional view taken along the line A-A shown in FIG. 1(a). Moreover, FIG. 2(a) is a schematic perspective view showing one embodiment of the piezoelectric actuator pursuant to the invention, FIG. 2(b) is a schematic sectional view taken along the line A-A shown in FIG. 2(a), and FIG. 2(c) is a schematic sectional view taken along the line B-B shown in FIG. 2(a).

Figure 1:
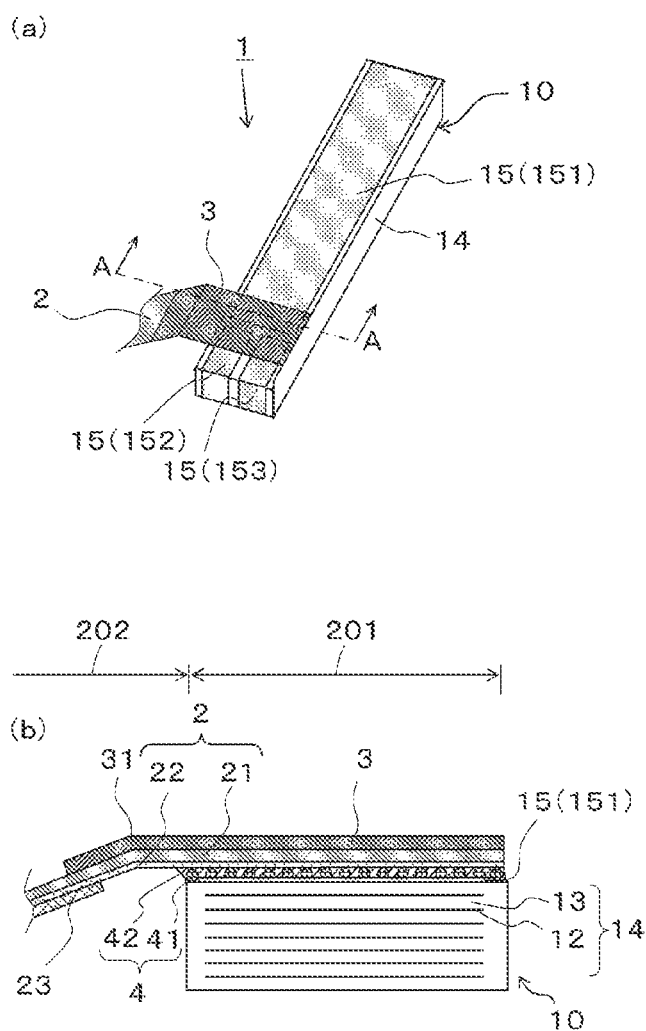
FIG. 1(a) is a schematic perspective view showing one embodiment of a piezoelectric actuator pursuant to the invention.
FIG. 1(b) is a schematic sectional view taken along the line A-A, shown in FIG. 1(a)
Figure 2:
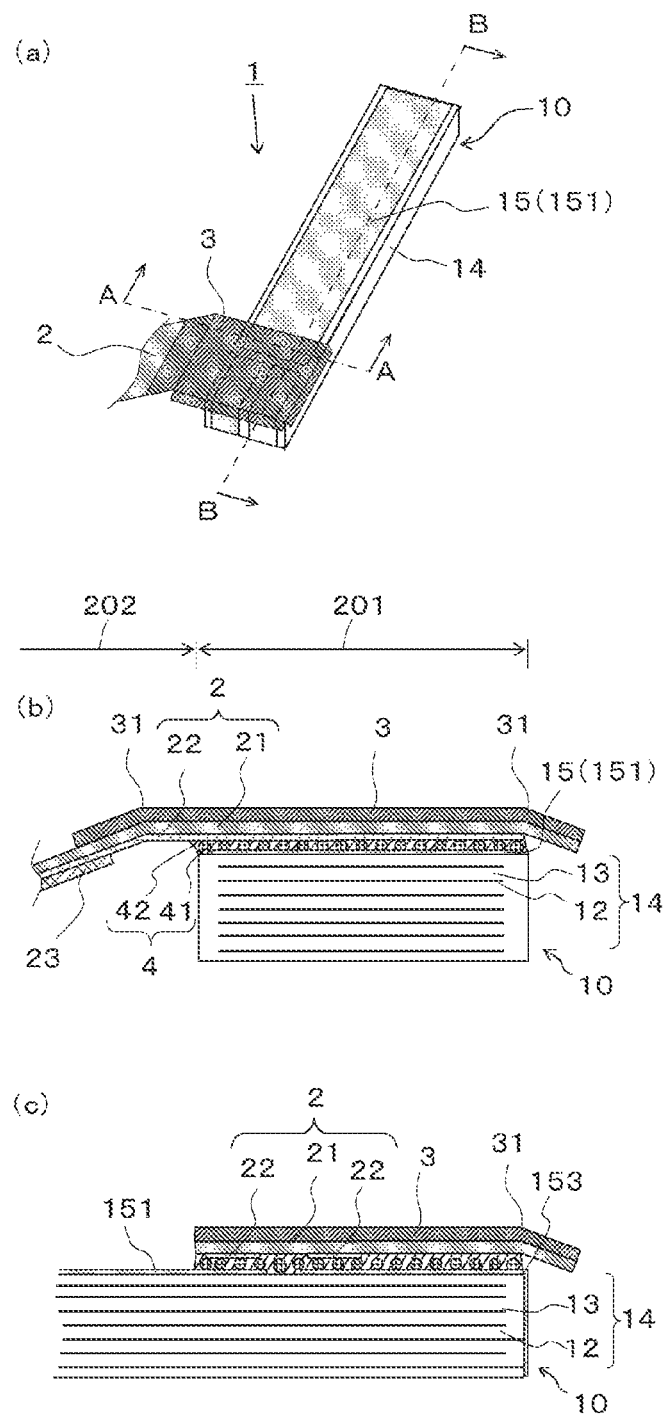
FIG. 2(a) is a schematic perspective view showing one embodiment of the piezoelectric actuator pursuant to the invention.
FIG. 2(b) is a schematic sectional view taken along the line A-A shown in FIG. 2(a)
FIG. 2(c) is a schematic sectional view taken along the line B-B shown in FIG. 2(a)

A piezoelectric actuator 1 of the embodiment as shown in FIGS. 1 and 2 comprises: a piezoelectric element 10 comprising a stacked body 14 in which internal electrodes 12 and piezoelectric layers 13 are laminated, and a surface electrode 15 disposed on one main surface of the stacked body 14 so as to be electrically connected to the internal electrode 12; a flexible substrate 2 electrically joined to the surface electrode 15; and a reinforcing plate 3 fixedly attached to a region of the flexible substrate 2 where the flexible substrate 2 overlaps with the piezoelectric element 10 as viewed in a stacking direction of the flexible substrate 2, and, the reinforcing plate 3 is provided with, a bend portion 31.

The piezoelectric actuator 1 of the present embodiment includes the piezoelectric element 10, and, the stacked body 14 constituting the piezoelectric element 10 is obtained by laminating the internal electrodes 12 and the piezoelectric layers 13 together and is formed in a plate shape. The stacked body 14 has an active section in which a plurality of the internal electrodes 12 overlap with one another in a stacking direction and an inactive section which is a part of the stacked body 14 other than the active section, and is given an elongated form, for example. In a case of the piezoelectric actuator installed in a display or casing of a portable terminal, the length of the stacked body 14 falls preferably in the range of, for example, 18 mm to 28 mm, and sore preferably in the range of 22 mm to 25 mm. The width of the stacked body 14 fails preferably in the range of, for example, 1 mm to 6 mm, and more preferably in the range of 3 mm to 4 mm. The thickness of the stacked body 14 falls preferably in the range of, for example, 0.2 mm to 1.0 mm, and more preferably in the range of 0.4 mm to 0.8 mm.

The internal electrode 12 constituting the stacked body 14, which is formed through co-firing with ceramics used to form the piezoelectric layer, is composed of first electrodes and second electrodes. For example, the first electrode serves as a grounding electrode, and the second electrode serves as a positive or negative electrode. The internal electrodes 12 and the piezoelectric layers 13 are alternately laminated in a manner such that one piezoelectric layer 13 lies between the internal electrodes 12 vertically, and the first electrodes and the second electrodes are arranged in a stacking order, so that a driving voltage can be applied to the piezoelectric layer 13 sandwiched between the first and second layers. As the constituent material, for example, a conductor composed predominantly of silver or a silver-palladium alloy whose reactivity with piezoelectric ceramics is low, or a conductor containing copper, platinum, or the like can be used, or alternatively, a material obtained by adding a ceramic component, or glass component to the aforementioned conductor can also be used.

In the embodiment shown in FIGS. 1 and 2, end portions of the first and second electrodes are led out to opposed paired side surfaces of the stacked body 4 in a staggered arrangement. In a case of the piezoelectric actuator installed in a display or casing of a portable terminal, the length of the internal electrode 12 falls preferably in the range of, for example, 17 mm to 25 mm, and more preferably in the range of 21 mm to 24 mm. The width of the internal electrode 12 falls preferably in the range of, for example, 1 mm to 5 mm, and more preferably in the range of 2 mm to 4 mm. The thickness of the internal electrode 12 falls preferably in the range of, for example, 0.1 to 5 μm.

The piezoelectric layer 13 constituting the stacked body 14 is made of ceramics having piezoelectric properties, and, as such ceramics, for example, a perovskite-type oxide composed of lead zirconate titanate ($PbZrO_3$—$PbTiO_3$), lithium niobate ($LiNbO_3$), or lithium tantalate ($LiTaO_3$) can be used. In order to effect driving operation under low-voltage conditions, it is desirable to adjust the single-layer thickness of the piezoelectric layer to fall in the range of 0.01 to 0.1 mm, for example. Moreover, it is preferable that the piezoelectric layer has a piezoelectric constant d31 of greater than or equal to 200 pm/V in the interest of production of large flexural vibration.

On one main surface of the stacked body 14 is disposed the surface electrode 15 electrically connected to the internal electrode 12. The surface electrode 15 of the embodiment shown in FIGS. 1 and 2 is composed of a first surface electrode 151 having a large area, and a second surface electrode 152 and a third, surface electrode 153 each having a small area. For example, the first surface electrode 151 is electrically connected to the internal electrode 12 which serves as the first electrode, the second surface electrode 152 is electrically connected to the internal electrode 12 which serves as the second electrode located on one main surface side, and the third surface electrode 153 is electrically connected to the internal electrode 12 which serves as the second electrode located on the other main surface side. In a case of the piezoelectric actuator installed in a display or casing of a portable terminal, the length of the first surface electrode 151 fails preferably in the range of, for example, 17 mm to 23 mm, and more preferably in the range of 19 mm to 21 mm. The width of the first surface electrode 151 fails preferably in the range of, for example, 1 mm to 5 mm, and more preferably in the range of 2 mm to 4 mm. The length of each of the second surface electrode 152 and the third surface electrode 153 falls preferably in the range of 1 mm to 3 mm, for example. The width of each of the second surface electrode 152 and the third surface electrode 153 falls preferably in the range of 0.5 mm to 1.5 mm, for example.

Moreover, the piezoelectric actuator 1 includes the flexible substrate 2 electrically joined to the surface electrode 15. Specifically, the flexible substrate 2 is, for example, a flexible printed wiring board comprising a base film 21 made of resin, two wiring conductors 22 disposed on the surface of the base film 21, and a cover film 23 disposed in a region other than the part joined to the piezoelectric element 10 and a vicinity thereof. Part of the flexible substrate 2 is joined, via an electrically-conductive joining member 4, to one main surface of the stacked body 14 constituting the piezoelectric element 10, and, the wiring conductor 22 is electrically connected to the surface electrode 15 via the electrically-conductive joining member 4.

While it is sufficient that the cover film 23 is located in a region other than the part of connection between the wiring conductor 22 and the surface electrode 15, in the case where the cover film 23 is disposed neither in a region where the wiring conductor 22 overlaps with the piezoelectric element 10 nor in a vicinity thereof, reliable electrical connection can be established without incurring the influence of the thickness of the cover film 2. For example, the flexible substrate 2 is joined at one end portion thereof to the piezoelectric element 10 and is joined at the other end portion thereof to an external circuit (connector).

While an electrically-conductive adhesive, solder, or the like can be used as the electrically-conductive joining member 4, an electrically-conductive adhesive is desirable for use. This is because, for example, in the case of using an electrically-conductive adhesive prepared by dispersing conductor particles 41 made of, for example, gold, copper, nickel, or gold-plated resin balls in a resin adhesive 42 made, of, for example, acrylic resin, epoxy resin, silicone resin, polyurethane resin, or synthetic rubber, as compared with the case of using solder, vibration-induced stress can be reduced. Among various electrically-conductive adhesives, an anisotropic conductive material is more desirable for use. The anisotropic conductive material is composed of conductive particles 41 responsible for electrical connection and a resin adhesive 42 responsible for adhesion. Specifically, a single conductive particle 41 makes contact with the surface electrode 15 and the wiring conductor 22. That is, the conductive particles 41 situated between the surface electrode 15 and the wiring conductor 22 are each kept in contact with the surface electrode 15 and the wiring conductor 22. The anisotropic conductive material 4, being capable of electrical continuity in its thickness direction and capable of insulation in its in-plane direction, is free from electrical short-circuiting between surface electrodes of different polarities even in narrow-pitch wiring, and it is possible to make the part of connection with the flexible substrate 2 compact.

Moreover, the piezoelectric actuator 1 of the present embodiment includes the reinforcing plate 3 fixedly attached to a region where the flexible substrate 2 overlaps with the piezoelectric element 10 as viewed in the stacking direction of the flexible substrate 2, and, the reinforcing plate 3 is provided with the bend portion 31.

The reinforcing plate 3 is made of, for example, a resin such as a glass epoxy material (FR-4), a composite material (CEM-3), polyetherimide, polyimide, or polyester, or a metal such as stainless steel, aluminum, or an alloy of such metals, and has a thickness of 50 to 200 μm, for example.

Moreover, the bend portion 31 indicates a part of the flexible substrate 2 which is bent in the thickness direction of the reinforcing plate 3 (the stacking direction of the piezoelectric element 10).

According to this structure, vibration of the flexible substrate 2 is absorbed by the reinforcing plate 3, and, when the vibration reaches the bend portion 31 of the reinforcing plate 3, the bend, portion 31 absorbs vibration energy, with the consequent attenuation of vibration. As a result, the flexible substrate 2 becomes resistant to separation even after long-term driving operation.

Particularly, since the flexible substrate 2 is bent in accordance with a position of the bend portion 31 of the reinforcing plate 3, it follows that the flexible substrate 2 abuts on the bend portion 31 of the reinforcing plate 3 so as to be bent, wherefore it is possible to absorb vibration of the flexible substrate 2 more effectively at the time of absorption of vibration energy in the bend portion 31.

It is preferable that the reinforcing plate 3 is greater in thickness than the flexible substrate 2. In this case, the vibration suppression effect can be increased. Moreover, it is preferable that the reinforcing plate 3 is bonded to the upper surface of the flexible substrate 2 via a resin adhesive. In this case, it is possible to suppress the vibration also in a part of the resin adhesive.

Herein, the flexible substrate 2 has a first region 201 where the flexible substrate 2 overlaps with the piezoelectric element 10 and a second region 202 where the flexible substrate 2 does not overlap with the piezoelectric element 10, and, the reinforcing plate 3 is disposed so as to extend from the first region 201 to the second region 202, and the bend portion 31 is preferably situated at the boundary of the first region 201 and the second region 202 (at the same position as the end face of the piezoelectric element 10) or situated outside of this boundary.

Figure 3:
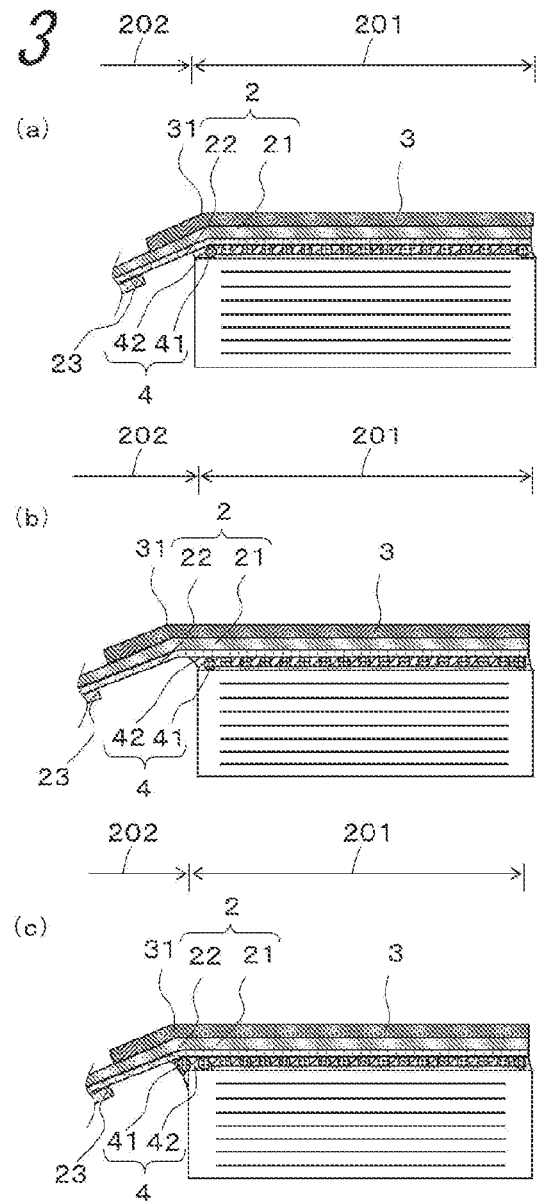
FIGS. 3(a) to 3(c) are schematic sectional views showing another embodiment of a piezoelectric actuator pursuant to the invention.

In contrast to a structure as shown in FIG. 3(*a*) in which the bend portion 31 is situated in the first region 201 (situated outwardly of the end face of the surface electrode 15, and situated inwardly of the end face ox the piezoelectric element 10) when viewed from above one main surface of the stacked body 14, in a structure as shown in FIGS. 1, 2, 3(*b*), and 3(*c*) in which the bend portion 31 is situated at the boundary of the first region 201 and the second region 202 (at the same position as the end face of the piezoelectric element 10) or situated outside of this boundary when viewed in the stacking direction, vibration is less prone to be transmitted to most part of the second region 202 of the flexible substrate 2. As a result, the flexible substrate 2 becomes more resistant to separation even after long-term driving operation. In addition, since vibration is less prone to be transmitted to the other end portion of the flexible substrate 2 (connector junction), it is possible to achieve noise reduction.

Moreover, as shown in FIG. 3(*c*), the flexible substrate 2 comprises the base film 21 and the wiring conductor 22 disposed on the lower surface of the base film 21, and, the wiring conductor 22 is joined, via the electrically-conductive joining member 4 (anisotropic conductive material), to the surface electrode 15 for electrical connection therewith, and the electrically-conductive joining member 4 (anisotropic conductive material) is preferably further provided so as to overlap with the bend portion 31 when viewed from above one main surface of the stacked body 14.

By further providing the electrically-conductive joining member 4 (anisotropic conductive material) so as to overlap with the bend portion 31 when viewed from above one main surface of the stacked body 14, the electrically-conductive joining member 4 (anisotropic conductive material) which overlaps with the bend portion 31 also functions to absorb vibration. Moreover, the area of adhesion between the piezoelectric element 10 and the flexible substrate 2 is increased, wherefore their separation is less prone to occur.

Moreover, although the effect of absorbing vibration can be obtained in so far as the reinforcing plate 3 is bent in its thickness direction to form the bend portion 31, it is particularly desirable to bend the reinforcing plate 3 toward the piezoelectric element 10 (downwardly). In this case, the reinforcing plate 3 attenuates vibration in such a way as to envelop the piezoelectric element 10, wherefore a stress tending to cause separation can be suppressed.

Moreover, as shown in FIGS. 1, 2, 3(*b*), and 3(*c*), the flexible substrate 2 includes the cover film 23 which is disposed in the second region 202 (disposed on the lower surface of the second region 202) so as to be spaced away from the first region 201 and covers part of the wiring conductor 22, and, the bend portion 31 is preferably located so as not to overlap with the cover film 23 when viewed from above one main surface of the stacked body 14. If the cover film 23 is located so as to overlap with the bend portion 31, there will arise additional vibration from the cover film 23, and the transmission of the vibration through the cover film 23 presents difficulties in facilitating vibration attenuation. On the other hand, the formation of the bend portion 31 in a cover film 23-free region is effective, because this makes it possible to achieve attenuation without incurring extra vibration of the cover film 23.

Moreover, as shown in FIGS. 1 and 2, it is preferable that the reinforcing plate 3 is extended so that a tip of the reinforcing plate 3 overlaps with the cover film 23 when viewed from above one main surface of the stacked body 14. For example, the reinforcing plate 3 is preferably extended so that the tip of the reinforcing plate 3 overlaps with the cover film 23 by 0.5 to 1 mm. In this case, the distance over which vibration can be absorbed by the reinforcing plate 3 can be lengthened, thereby facilitating attenuation.

Moreover, it is preferable that the base film 21 and the reinforcing plate 3 are made of the same material. For example, in a case where the base film 21 and the reinforcing plate 3 are made of polyimide, since the base film 21 and the reinforcing plate 3 are equal in mechanical properties, it follows that the base film and the reinforcing plate are less prone to be separated from each other due to the difference in thermal expansion between them.

Although an end of the electrically-conductive joining member 4 (anisotropic conductive material) is, as exemplified in FIGS. 1 and 2, aligned with an end of the stacked body 14, the end of the electrically-conductive joining member 4 may be extended toward the cover film 23, or may be extended from the corner of the piezoelectric element 10 to the cover film 23. This makes it possible to design the electrically-conductive joining member 4 (anisotropic conductive material) to have the capability of protecting the wiring conductor 22, and thereby prevent damage to the wiring conductor 22 through friction with the corner of the piezoelectric element 10.

Moreover, the corner of the piezoelectric element 10 covered with the flexible substrate 2 may be chamfered.

By rendering the other main surface of the piezoelectric element 10 flat, for example, when the other main surface is bonded to an object subjected to vibration (for example, a vibration plate as will hereafter be described), it is possible to readily cause the piezoelectric element to flexurally vibrate unitarily with the object subjected to vibration, and thereby increase the efficiency of flexural vibration in the construction as a whole.

While the piezoelectric actuator 1 pursuant to the invention is a so-called bimorph-type piezoelectric actuator which is flexurally vibrated in a manner such that one and the other main surfaces thereof become flexural surfaces upon the input of an electric signal from the surface electrode 15, the piezoelectric actuator of the invention is not limited to the bimorph-type, but may be of a unimorph-type. For example, it is possible to impart flexural vibration to the unimorph-type piezoelectric actuator by joining (bonding) the other main surface of the piezoelectric actuator to a vibration plate which will hereafter be described.

Next, a method of manufacturing the piezoelectric actuator 1 of the present embodiment will be described.

First, a ceramic green sheet which constitutes the piezoelectric layer 13 is formed. Specifically, a ceramic slurry is prepared by mixing calcined powder of piezoelectric ceramics, a binder made of an organic high polymer such as acrylic polymer or butyral polymer, and a plasticizer. Then, a ceramic green sheet is formed with use of the ceramic slurry by a tape molding technique such as the doctor blade method or the calender roll method. The piezoelectric ceramics may be of any given type so long as it has piezoelectric properties, and, for example, a perovskite-type oxide made of lead zirconate titanate ($PbZrO_3$—$PbTiO_3$) can be used. Moreover, as the plasticizer, dibutyl phthalate (DBP), dioctyl phthalate (DOP), or the like can be used.

Next, an electrically-conductive paste which constitutes the internal electrode 12 is formed. Specifically, the electrically-conductive paste is prepared by admixing a binder and a plasticizer in metal powder of a silver-palladium alloy. This electrically-conductive paste is applied, in an internal-electrode 12 pattern, onto the above-described ceramic green sheet by means of screen printing. Then, a plurality of the ceramic green sheets with the printed electrically-conductive paste are laminated on top of each other, and, the laminate is subjected to binder removal treatment at a predetermined temperature, is fired at a temperature of 900 to 1200° C., and is ground into a predetermined shape by means of a surface grinder or otherwise, whereby a stacked body 14 in which internal electrodes 12 and piezoelectric layers 13 are alternately laminated can be produced.

The way of producing the stacked body 14 is not limited to the method thus far described, and the stacked body 14 can therefore be produced by any given manufacturing method so long as it allows production of a stacked body 14 in which a plurality of internal electrodes 12 and piezoelectric layers 13 are laminated.

Subsequently, the surface electrode 15 is formed by printing an electrically-conductive paste containing silver glass, which is prepared by adding a binder, a plasticizer, and a solvent to a mixture of glass and conductive particles composed predominantly of silver, on the main and side surfaces of the stacked body 14 in a surface-electrode 15 pattern by means of screen printing or otherwise, drying the paste, and performing baking at a temperature of 650 to 750° C.

In a case where the surface electrode 15 and the internal electrode 12 are electrically connected to each other, it is possible to form a via-hole penetrating through the piezoelectric layer 13 or form a side electrode on the side surface of the stacked body 14 for the electrical connection; that is, any given manufacturing method may be adopted.

Next, the flexible substrate 2 and the reinforcing plate 3 are prepared. For example, a polyimide sheet which has previously been worked into a predetermined shape having a thickness of, for example, 125 μm (segmentable sheet for the reinforcing plate) is bonded at a predetermined position of the surface of a wiring conductor 22-free side of a sheet bearing an arrangement of a large number of flexible substrates 2 (base films 21) (segmentable sheet for the base film) with a thermosetting resin adhesive. At this time, the reinforcing plate 3 having the bend portion 31 can be obtained by working the sheet for the reinforcing plate into the final shape concurrently with the process of separating the flexible substrates 2 from the sheet (obtaining separate flexible substrate segments), or by bonding a reinforcing plate 3 which has previously been worked into the final shape with a die or the like to a predetermined position at the start of preparation process.

Next, the flexible substrate 2 is fixedly connected (joined) to the piezoelectric element 10 with use of an electrically-conductive joining member.

First, a coating of an electrically-conductive adhesive paste made of, for example, solder, a silver paste, or an anise-tropic conductive material is formed in a predetermined position of the piezoelectric element 10 by means of screen printing or otherwise. After that, the electrically-conductive adhesive paste is cured while being kept in contact with the flexible substrate 2, whereupon the flexible substrate 2 is fixedly connected to the piezoelectric element 10. Note that a coating of the electrically-conductive adhesive paste may alternatively be formed on the flexible substrate 2 side.

In a case where the electrically-conductive joining member 4 is an electrically-conductive adhesive, and a resin constituting the electrically-conductive adhesive is made of a thermoplastic resin, after a coating of the electrically-conductive adhesive is formed in a predetermined position of the piezoelectric element 10 or the flexible substrate 2, heat and pressure are applied to the piezoelectric element 10 and the flexible substrate 2 in a condition of making contact with each other via the electrically-conductive adhesive, whereupon the thermoplastic resin is softened and fluidized, and subsequently, by returning the present temperature to room, temperature, the thermoplastic resin is cured once again, whereupon the flexible substrate 2 can be fixedly connected to the piezoelectric element 10.

Moreover, although the above description deals with the method of forming a coating of the electrically-conductive adhesive on the piezoelectric element 10 or the flexible substrate 2, while interposing an electrically-conductive adhesive sheet which is shaped in a sheet form in advance, between the piezoelectric element 10 and the flexible substrate 2, application of heat and pressure for the connection may be carried out.

Moreover, it is advisable that, with use of a die of predetermined shape, the flexible substrate 2 as will hereafter be described is joined to the piezoelectric element 10, and simultaneously the reinforcing plate 3 is fixedly attached to the flexible substrate 2, and the bend portion 31 is formed in the reinforcing plate 3.

Figure 4:
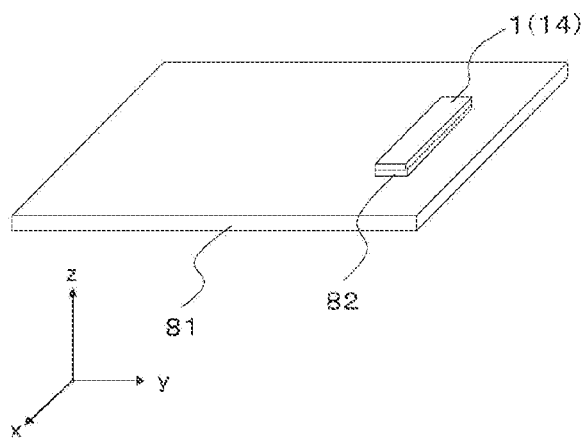
FIG. 4 is a schematic perspective view schematically showing a piezoelectric vibration apparatus in accordance with an embodiment of the invention.

As shown in FIG. 4, a piezoelectric vibration apparatus pursuant to the invention comprises: the piezoelectric actuator 1; and a vibration plate 81 joined to the other main surface of the stacked body 14 constituting the piezoelectric actuator 1. The piezoelectric actuator 1 employed in this construction refers to the piezoelectric actuator 1 shown in FIGS. 1 to 3.

The vibration plate 81 has a shape of a rectangular thin plate. The vibration plate 81 can be formed with proper use of a material having high rigidity and great elasticity such as acrylic resin or glass. Moreover, a thickness of the vibration plate 81 is set in the range of 0.4 mm to 1.5 mm, for example.

The vibration plate 81 is attached, through a joining member 82, to the other main surface of the piezoelectric actuator 1. The other main surface may either be entirely joined or be substantially entirely joined to the vibration plate 81 through the joining member 82.

The joining member 82 is higher in deformability than the vibration plate 81. That is, the joining member 82 can be deformed when the vibration plate 81 is vibrated by driving the piezoelectric actuator 1, and, given that the joining member 82 and the vibration plate 81 are subjected to the same force, then the joining member 82 becomes deformed more greatly than the vibration plate 81. Such a joining member 82 has the shape of a film, for example. Moreover, the joining member 82 is made of a material which is softer and more deformable than the vibration plate 81, and is thus smaller than the vibration plate 81 in respect of coefficient of elasticity and rigidity such as Young's modulus, modulus of rigidity, and modulus of volume elasticity. The other main surface (the main surface pointing in the −z direction in the drawing) of the piezoelectric actuator 1 is entirely fixed to one main surface (the main surface pointing in the +z direction in the drawing) of the joining member 32, and, part of one main surface (the main surface pointing in the +z direction in the drawing) of the vibration plate 81 is fixed to the other main surface (the main surface pointing in the −z direction in the drawing) of the joining member 82.

In the case where the piezoelectric actuator 1 and the vibration plate SI are joined to each other by the joining member 82 which is higher in deformability than the vibration plate 81, upon transmission of vibration from the piezoelectric actuator 1, the deformable joining member 82 becomes deformed more greatly than the vibration plate 81.

At this time, vibration in reverse phase reflected from the vibration plate 81 can be mitigated by the deformable joining member 82, wherefore the piezoelectric actuator 1 is capable of transmitting strong vibration to the vibration plate 81 without incurring the influence of ambient vibration.

In particular, it is preferable that the joining member 82 is, at least partly, made of a viscoelastic body, because, in this case, strong vibration from the piezoelectric actuator 1 can be transmitted to the vibration plate 81, and weak vibration reflected from the vibration plate 81 can be absorbed by the joining member 82. For example, it is possible to use a double-faced tape in which an adhesive is applied to both sides of a base material made of a nonwoven fabric or the like, or a joining member including: an adhesive having elasticity, the thickness of which, falls in the range of 10 μm to 2000 μm, for example.

The joining member 82 may either be of a one-piece member or of a composite body composed of several members. As such a joining member 82, for example, a double-faced tape in which an adhesive is applied to both sides of a base material made of a nonwoven fabric or the like, or a variety of elastic adhesives that are adhesives having elasticity are desirable for use. Moreover, the thickness of the joining member 82 is preferably greater than the amplitude of flexural vibration of the piezoelectric actuator 1. However, since too large a thickness will cause attenuation of vibration, the thickness is set to fall in the range of 0.1 mm to 0.6 mm, for example. However, in the piezoelectric vibration apparatus of the invention, there is no particular limitation to the material used for the joining member 82, and the joining member 82 may therefore be made of a material which is harder and less deformable than the vibration plate 81. Moreover, under certain circumstances, the joining member 82 may be omitted from the construction.

The thereby constructed piezoelectric vibration apparatus of the present embodiment functions as a piezoelectric vibration apparatus in which the piezoelectric actuator 1 is flexurally vibrated upon application of an electric signal, and the vibration plate 81 is vibrated in response to the flexural vibration. Note that the other end portion of the vibration plate 81 in a lengthwise direction thereof (the end portion pointing in the −y direction in the drawing or an edge portion of the vibration plate 81) may be supported by a non-illustrated support member.

Since the piezoelectric vibration apparatus of the present embodiment is constructed with use of the piezoelectric actuator 1 in which separation of the flexible substrate 2 is suppressed, it is possible to obtain a piezoelectric vibration apparatus which can be driven with stability for a long period of time.

Moreover, in the piezoelectric vibration apparatus of the present embodiment, the vibration plate 81 is joined to the flat other main surface of the stacked body 14 constituting the piezoelectric actuator 1. Thus, it is possible to obtain the piezoelectric vibration apparatus in which the piezoelectric actuator 1 and the vibration plate 81 are firmly joined to each other.

Figure 5:
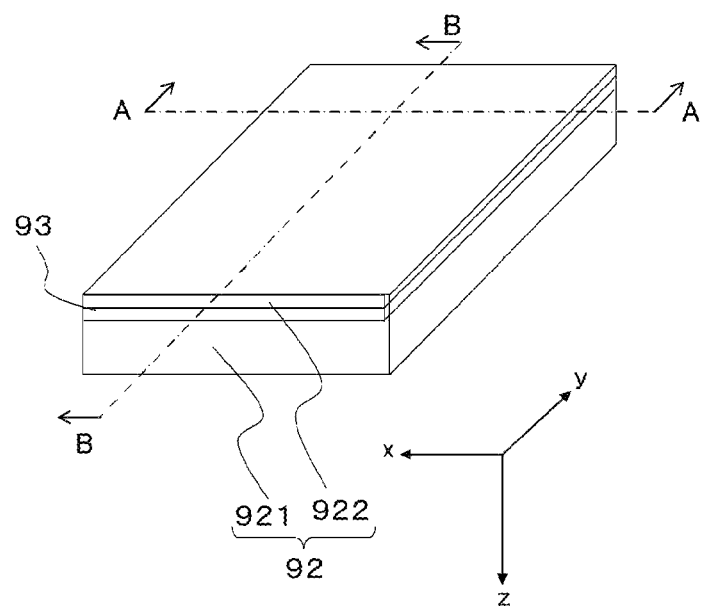
FIG. 5 is a schematic perspective view schematically showing a portable terminal in accordance with an embodiment of the invention.
Figure 6:
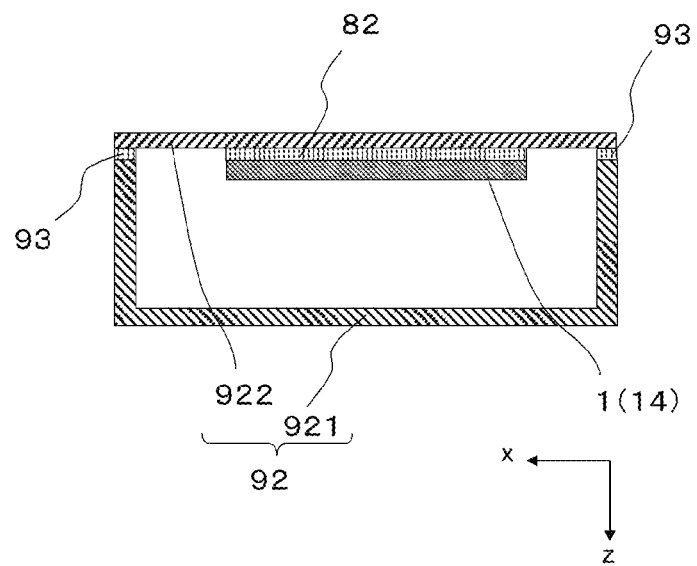
FIG. 6 is a schematic sectional view taken along the line A-A shown in FIG. 5.
Figure 7:
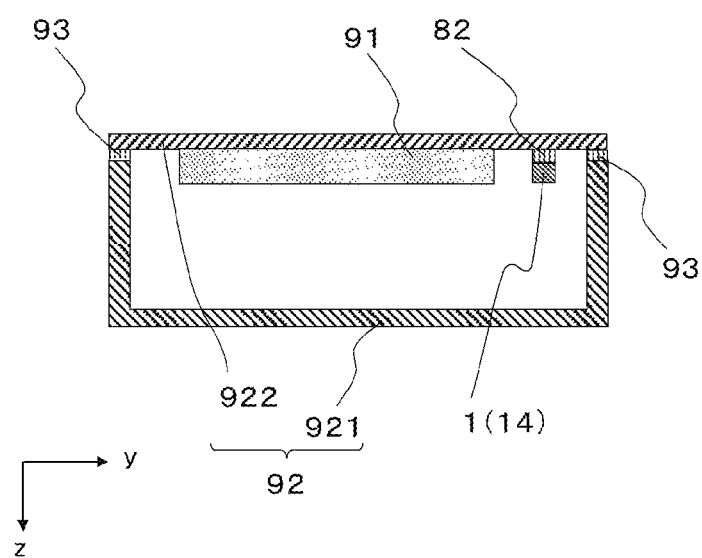
FIG. 7 is a schematic sectional, view taken along the line B-B shown in FIG. 5.

As shown in FIGS. 5 to 7, a portable terminal pursuant to the invention comprises: the piezoelectric actuator 1; an electronic circuit (not shown); a display 91; and a casing 92, and the other main surface of the stacked body 14 constituting the piezoelectric actuator 1 is joined to the display 91 or the casing 92. FIG. 5 is a schematic perspective view schematically showing the portable terminal of the invention, FIG. 6 is a schematic sectional view taken along the line A-A shown in FIG. 5, and FIG. 7 is a schematic sectional view taken, along the line B-B shown in FIG. 5.

In this embodiment, the piezoelectric actuator 1 is attached to part of the casing 92 serving as a cover for the display 91, and this part of the casing 92 functions as a vibration plate 922.

The casing 92 comprises: a box-shaped casing main body 921 with one surface thereof left opened; and the vibration plate 922 which blocks an opening of the casing main body 921. The casing 92 (the casing main body 921 and the vibration plate 922) can foe formed with proper use of a material having high rigidity and great elasticity such as synthetic resin.

An edge portion of the vibration plate 922 is attached to the casing main body 921 via a joining material 93 so as to be capable of vibration. The joining material 93 is made of a material which is softer and becomes deformed more easily than the vibration plate 922, and is thus smaller than the vibration plate 922 in respect of coefficient of elasticity and rigidity such as Young's modulus, modulus of rigidity, and modulus of volume elasticity. That is, the joining material 93 is deformable, and, given that the joining material 93 and the vibration plate 922 are subjected to the same force, then the joining material 93 becomes deformed more greatly than the vibration plate 922.

The joining material 93 may either be of a one-piece member or of a composite body composed of several members. As such a joining material 93, for example, a double-faced tape in which an adhesive is applied to both sides of a base material made of a nonwoven fabric or the like is desirable for use. The joining material 93 is designed so as not to have too large a thickness which will cause attenuation of vibration, and more specifically the thickness of the joining material 93 fails in the range of 0.1 mm to 0.6 mm, for example. However, in the portable terminal of the invention, there is no particular limitation to the material used for the joining material 93, wherefore the joining material 93 may be made of a material which is harder and less deformable than the vibration plate 922. Moreover, under certain circumstances, the joining material 93 may be omitted from the construction.

Exemplary of the electronic circuit (not shown) are a circuit for processing image information to foe shown on the display 91 and sound information to foe transmitted by the portable terminal, a communication circuit, and so forth. The electronic circuit may either be of at least one of the aforementioned circuits or include all of these circuits. Moreover, the electronic circuit may foe of a circuit having other different capability. Furthermore, a plurality of electronic circuits may be provided. The electronic circuit and the piezoelectric actuator 1 are connected to each other by means of non-illustrated wiring for connection.

The display 91 is a display device having the function of displaying image information, and, a known display such for example as a liquid crystal display, a plasma display, or an organic EL display can be preferably used as the display 91. The display 91 may be designed to have an input device such as a touch panel. Moreover, the cover (vibration plate 922) for the display 91 may be designed to have an input device such as a touch panel. Furthermore, the display 91 may be, in its entirety or in part, designed to function as a vibration plate.

Herein, it is preferable that the piezoelectric actuator 1 and the casing 92 (vibration plate 922) are joined to each other with use of a joining member which is higher in deformability than the casing 92 (vibration plate 922). That is, in FIGS. 6 and 7, the joining member 82 is a deformable joining member.

In the case of joining the piezoelectric actuator 1 and the casing 92 by the joining member 82 which is higher in deformability than the casing 92, upon transmission of vibration from the piezoelectric actuator 1, the deformable joining member 82 becomes deformed more greatly than the casing 92. The joining member 82 can be deformed when the casing 92 is vibrated by driving the piezoelectric actuator 1, and, given that the joining member 82 and the casing 92 are subjected to the same force, then the joining member 82 becomes deformed more greatly than does the casing 92. Such a joining member 82 has the shape of a film, for example. Moreover, the joining member 82 is made of a material which is softer and becomes deformed more easily than the casing 92, and is thus smaller than the casing 92 in respect of coefficient of elasticity and rigidity such as Young's modulus, modulus of rigidity, and modulus of volume elasticity.

At this time, vibration in reverse phase reflected from the casing 92 can be mitigated by the deformable joining member 82, wherefore the piezoelectric actuator 1 is capable of transmitting strong vibration to the casing 92 without incurring the influence of ambient vibration.

In particular, it is preferable that the joining member 82 is, at least partly, made of a viscoelastic body, because, in this case, strong vibration from the piezoelectric actuator 1 can be transmitted to the casing 92, and weak vibration reflected from the casing 92 can be absorbed by the joining member 82. For example, it is possible to use a double-faced tape in which an adhesive is applied to both sides of a base material made of a nonwoven fabric or the like, or a joining member including an adhesive having elasticity, the thickness of which fails in the range of 10 μm to 2000 μm, for example.

While the present embodiment has been described with respect to the case where the piezoelectric actuator 1 is joined to the casing 92, the piezoelectric actuator 1 may be joined to the display 91. In this case, it is preferable that the piezoelectric actuator 1 and the display 91 are joined to each other with use of a joining member which is higher in deformability than the display 91.

Moreover, the portable terminal of the invention is characterized in that the display 91 of the casing 92 produces vibration to transmit sound information through ear cartilage or by air conduction. The portable terminal of the present embodiment is capable of effecting transmission of sound information by transmitting vibration to ear cartilage through the direct contact of the vibration plate (the display 91 or the casing 92) with the ear, or the contact of the vibration plate with the ear via other object. That is, transmission of sound information can be achieved by transmitting vibration to ear cartilage through the direct or indirect contact of the vibration plate (the display 91 or the casing 92) with the ear. Thus, it is possible to implement a portable terminal capable of effecting transmission of sound information even in a noisy environment, for example. Note that the object to be placed between the vibration plate (the display 91 or the casing 92) and the ear may be any given object so long as it is capable of transmission of vibration, and therefore, for example, a cover for the portable terminal, headphones, earphones, and so forth may be interposed. Moreover, the portable terminal may be designed to effect transmission of sound information by causing sound produced from the vibration plate (the display 91 or the casing 92) to propagate through the air. Furthermore, the portable terminal may be designed to transmit sound information via a plurality of routes.

Since the portable terminal of the present embodiment employs the piezoelectric actuator 1 in which separation of the flexible substrate 2 is suppressed for transmission of sound information, it is possible to transmit high-quality sound information for a long period of time.

EXAMPLE

Next, a specific example of the piezoelectric actuator of the invention will be explained.

The piezoelectric actuator was produced in the following manner.

The piezoelectric element was given an elongated form which is 23.5 mm in length, 3.3 mm in width, and 0.5 mm in thickness. Moreover, the piezoelectric element was constructed by laminating 30 μm-thick piezoelectric layers and internal electrodes alternately, and, the total number of the piezoelectric layers was 16. The piezoelectric layer was made of lead zirconate titanate in which Sb was substituted in part for Zr. A silver-palladium alloy was used for the internal electrode.

After ceramic green sheets with printed, silver palladium-made electrically-conductive pastes were laminated on top of each other, the laminate was pressurized so that the ceramic green sheets adhered tightly to each other, was subjected to degreasing treatment at a predetermined temperature, and was fired at 1000° C., whereupon a stacked sintered product was obtained.

Next, the surface electrode was obtained by printing a silver-made electrically-conductive paste in a manner such that each widthwise end of the surface electrode extends beyond the widthwise end of the internal electrode by an amount of 1 mm.

A voltage having an electric field strength of 2 kV/mm was applied between the internal electrodes (the first and second electrodes) through the surface electrode to initiate a polarization of the piezoelectric element.

Moreover, the flexible substrate and the reinforcing plate were produced in the following manner. To begin with, copper foil that constitutes the wiring conductor was bonded to a polyimide film in the form of a sheet bearing an arrangement of a large number of base films (segmentable sheet for the base film) with an adhesive. Next, a conductor pattern of the wiring conductor was formed by means of photolithography, and, for the sake of insulation and conductor protection, a polyimide film which constitutes the cover film was bonded with an adhesive. Next, following a gold-plating process, a 125 μm-thick polyimide sheet which constitutes the reinforcing plate (segmentable sheet for the reinforcing plate) was bonded to the wiring conductor-free surface of the segmentable sheet for the base film with a thermosetting adhesive, and, the sheet body was punched into a predetermined shape with a die, whereupon the flexible substrate and the reinforcing plate were produced. The reinforcing plate for use was given a shape as shown in FIG. 2 having a bend portion which had previously been made under application of pressure with a die of predetermined shape.

Then, in order to provide electrical connection between the wiring conductor of the flexible substrate and the surface electrode, a paste was prepared by dispersing, in a synthetic rubber-based adhesive, electrically-conductive particles having a particle size of about 5 μm that had been obtained by applying a gold coating plated with Ni as an undercoat onto acrylic resin-made particle main bodies, and, the paste was printed on the surface electrode by means of screen printing, and thereafter the flexible substrate was pressed under heat, whereupon the piezoelectric actuator was produced.

Meanwhile, as a comparative example, another piezoelectric actuator was produced with use of a flexible substrate having no reinforcing plate in the same manner as that adopted to produce the example thus far described.

Then, a reliability test was conducted on each of the piezoelectric actuators bonded to a vibration plate. After the piezoelectric actuators had been driven under continuous application of sinusoidal signals in 100000 cycles, in the piezoelectric actuator of the comparative example, the amount of displacement of the vibration plate became 0. Moreover, as a result of analyzing an interior of the actuator, in the piezoelectric actuator of the comparative example, the flexible substrate was separated from the piezoelectric element and thus voltage application was not effected. By contrast, in the piezoelectric actuator of the example of the invention, a displacement of about 4 μm was confirmed in the vibration plate, and there was no sign of separation of the flexible substrate.

REFERENCE SIGNS LIST

1: Piezoelectric actuator
10: Piezoelectric element
12: Internal electrode
13: Piezoelectric layer
14: Stacked body
15: Surface electrode
151: First surface electrode
152: Second surface electrode
153: Third surface electrode
2: Flexible substrate
201: First region
202: Second region
21: Base film
22: Wiring conductor
23: Cover film
3: Reinforcing plate
31: Bend portion
4: Electrically-conductive joining member
41: Conductive particle
42: Resin adhesive
81: Vibration plate
82: Joining member
91: Display
92: Casing
921: Casing main body
922: Vibration plate
93; Joining material

The invention claimed is:

1. A piezoelectric actuator, comprising:
a piezoelectric element which comprises a stacked body in which internal electrodes and piezoelectric layers are laminated, and a surface electrode disposed on one main surface of the stacked body so as to be electrically connected to the internal electrodes;
a flexible substrate electrically joined to the surface electrode; and
a reinforcing plate fixedly attached to a region of the flexible substrate where the flexible substrate overlaps with the piezoelectric element,
wherein the flexible substrate has a first region where the flexible substrate overlaps with the piezoelectric element, and a second region where the flexible substrate does not overlap with the piezoelectric element, the reinforcing plate is disposed so as to extend from the first region to the second region, and
the reinforcing plate is provided with a bend portion, and the bend portion is situated at a boundary of the first region and the second region or situated outside of the boundary.

2. The piezoelectric actuator according to claim 1, wherein the flexible substrate comprises a base film and a wiring conductor, the wiring conductor is joined to the surface electrode for electrical connection therewith via an anisotropic conductive material which is provided so as to overlap with the bend portion when viewed from above the one main surface.

3. The piezoelectric actuator according to claim 1, wherein the reinforcing plate is bent toward the piezoelectric element.

4. The piezoelectric actuator according to claim 2, wherein the flexible substrate includes a cover film which is disposed in the second region so as to be spaced away from the first region and covers part of the wiring conductor, and the bend portion is located so as not to overlap with the cover film when viewed from above the one main surface.

5. The piezoelectric actuator according to claim 4, wherein the reinforcing plate is extended so that a tip of the reinforcing plate overlaps with the cover film when viewed from above the one main surface.

6. The piezoelectric actuator according to claim 2, wherein the base film and the reinforcing plate are made of the same material.

7. A piezoelectric vibration apparatus, comprising:
the piezoelectric actuator according to claim 1; and
a vibration plate joined to the other main surface of the stacked body constituting the piezoelectric actuator.

8. The piezoelectric vibration apparatus according to claim 7, wherein the piezoelectric actuator and the vibration plate are joined to each other with a joining member that has a higher deformability than the vibration plate.

9. A portable terminal, comprising:
the piezoelectric actuator according to claim 1;
an electronic circuit;
a display; and
a casing,
the display or the casing being joined with the other main surface of the stacked body of the piezoelectric actuator.

10. The portable terminal according to claim 9, wherein the piezoelectric actuator and one of the display or the casing are joined to each other with a joining member that has a higher deformability than the display or the casing.

* * * * *